United States Patent [19]

Peiffer et al.

[11] Patent Number: 4,801,878
[45] Date of Patent: Jan. 31, 1989

[54] IN-CIRCUIT TRANSISTOR BETA TEST AND METHOD

[75] Inventors: Ronald J. Peiffer, Fort Collins; David T. Crook, Loveland, both of Colo.

[73] Assignee: Hewlett-Packard Company, Palo Alto, Calif.

[21] Appl. No.: 64,157

[22] Filed: Jun. 18, 1987

[51] Int. Cl.[4] .............................................. G01R 31/22
[52] U.S. Cl. ........................... 324/158 T; 324/158 D; 324/73 R; 324/158 R
[58] Field of Search ............ 330/2; 324/158 T, 158 D, 324/158 R, 73 R

[56] References Cited

U.S. PATENT DOCUMENTS

| | | | |
|---|---|---|---|
| 3,430,152 | 2/1969 | Walsh | 330/2 X |
| 4,135,153 | 1/1979 | Stone | 324/158 T |
| 4,142,150 | 2/1979 | Morrow et al. | 324/158 T |

FOREIGN PATENT DOCUMENTS

| | | | |
|---|---|---|---|
| 0214942 | 10/1984 | Fed. Rep. of Germany | 324/158 T |
| 2086682 | 5/1982 | United Kingdom | 330/2 |

OTHER PUBLICATIONS

Simpson; "Build and In-Circuit Transistor Tester"; Electronics Australia; Apr., 1977; vol. 39, No. 1; pp. 37–39.
Hojak; "Automatic Measurement of Transistor Beta"; Electronics; Dec. 4, 1959; pp. 114–115.
Graeme; "Accurate Transistor Tests Can Be Made Inexpensively"; Electronics; Feb. 28, 1972; pp. 84–89.
Hewlett-Packard Company, "3253A Operating and Serivce Manual," (HP part number 03253-90001), Section 3, p. 11.

Primary Examiner—Reinhard J. Eisenzopf
Assistant Examiner—Vinh P. Nguyen
Attorney, Agent, or Firm—William W. Cochran

[57] ABSTRACT

An in-circuit test device and method for testing transistors which are connected to various components on a printed circuit board. The present invention uses a fully automated system which provides a constant emitter current to bias the transistor to a predetermined level and prevents the transistor from going into saturation due to variations in the gain of different transistors. The collector lead and base lead are maintained at approximately ground potential so that the collector emitter voltage drop is maintained above the saturation voltage for transistors since the base emitter junction is biased by a constant emitter current placed in the emitter lead. Transistor gain is determined from the difference in two separate d.c. emitter currents which eliminates the effects of parallel impedance paths resulting from other components connected to the transistor on the printed circuit board. An operational amplifier having a feedback resistance is used so that the output voltage is directly proportional to the current flowing through the base of the transistor.

17 Claims, 4 Drawing Sheets

IN-CIRCUIT TRANSISTOR BETA TEST AND METHOD

BACKGROUND OF THE INVENTION

1. Field of the Invention

Present invention pertains generally to measuring and testing devices and more particularly to an in-circuit test device for testing transistors.

2. Description of the Background

Quality control plays an important role in present day manufacturing and production techniques. A key factor in controlling the quality of electronic products is the ability to test component systems prior to final assembly of the device. Loaded printed circuit boards have been tested in a number of different ways in the past. One method comprises Functional Testing in which signals are applied to the input of the board and the output of the board is monitored and compared to desired results to determine if the board is functioning properly. The simplest implementations of this technique merely provide a pass/fail result for each particular board tested with no indication of the identity or location of malfunctioning components in the board. Failure rates of the boards are normally much too high to rely upon Functional Testing as the only method of testing PC boards prior to assembly of the product. More complex Functional Testing Systems provide more information as to the identity and location of malfunctioning components on the PC board and have been used with some success as singular testing systems. These more complex Functional Testing Systems attempt to locate non-functioning components in the PC board by carefully analyzing the output of a non-functioning board for a series of specially programmed input signals that are designed to produce outputs which differ for each component, or series of components, that are defective. Of course, these more complex systems are difficult to produce because of the high degree of complexity of programming input signals and analyzing output data to determine the identity and location of one or more improperly functioning components, especially when large and more complex boards are being tested. Moreover, these tests, due to their complexity, often cannot provide sufficient information as to the location of non-functioning components so that further testing is required to prevent a high scrap rate of the PC boards. For these reasons, in-circuit testing techniques have been developed that individually test components which have been mounted on the PC board. In-circuit testing of a PC board, in this manner, clearly identifies the location of non-functioning components.

A number of problems, however, exist using in-circuit testing techniques. For example, since a large number of inter-connecting conductive paths are present between the components mounted on a PC board under test, various feedback paths are created.

A basis for testing all components using in-circuit test techniques is that a standardized test procedure be used for corresponding components on different boards. If the test must be customized each time a corresponding component is tested, such as by requiring different threshold values of current or voltage, the test cannot be easily automated to provide reliable results. A typical problem which exists in testing transistors is that the beta of the transistor can vary up to an order of magnitude. Some prior art devices have typically applied a constant base current and measured collector current to determine the beta of the transistor. If the beta of the transistor is high, a large current is drawn through the collector which decreases the collector/emitter voltage drop to the saturation voltage of the transistor. A typical circuit implementing these prior art techniques is disclosed in the 3253A Operating and Service Manual, page 3-11, section 320, Hewlett-Packard part #03253-90001, available from Manufacturing Test Division, Hewlett-Packard Company, P.O. Box 301, Loveland, CO 80539, which discloses operation and programming of the Model 3253A Analog In-Circuit Test Device for testing the beta of a transistor. When the transistor is in saturation, the beta of the transistor cannot be tested. To prevent the transistor from going into saturation the standardized base current must be reduced. Hence, the test fails as an automated procedure for testing the beta of the transistor when a high beta transistor is encountered. These problems cannot be readily overcome by providing a higher collector/emitter voltage drop since, as set forth above, a greater voltage drop will cause other active components on the board to be activated. Also, since the beta of the transistor in some prior art testing techniques has been computed using an a.c. signal, capacitive feedback loops often cause erroneous gain calculations.

SUMMARY OF THE INVENTION

The present invention overcomes the disadvantages and limitations of the prior art by providing an automated in-circuit test procedure for testing the beta of transistors which is substantially indifferent to variations in beta of the transistor. Unlike prior art techniques in which a constant base current is provided, the present invention generates a constant emitter current so that the collector current is substantially independent of the beta of the transistor. The present invention, additionally, fixes the collector voltage and base voltage at substantially the same level so that the collector/emitter voltage drop is essentially the same as the base/emitter voltage drop which is sufficient to prevent the transistor from going into saturation. Additionally, the present invention uses two different d.c. voltage levels rather than an a.c. signal to eliminate feedback loops having series coupled capacitors Moreover, two different d.c. level signals are used to test the transistor and the difference between the two d.c. level signals is used to calculate the gain of the transistor to eliminate the effects of leakage currents resulting from other components on the printed circuit board that are connected to the transistor under test. Also, the constant emitter current is produced by a constant voltage source which is substantially larger than the base/emitter voltage drop, i.e., on the order of two to ten times as large, or larger. By using a large voltage ratio, variations in the base/emitter voltage drop for each of the various transistors tested does not substantially affect the current generated in the emitter lead of the transistor.

The advantages of the present invention are that an automated procedure can be used for testing the beta of the transistor using low voltages to prevent other components from being activated while maintaining a sufficiently high collector/emitter voltage to prevent the transistor from going into saturation and eliminating the effects of other components connected to the transistor on the printed circuit board by using differential d.c. currents to calculate beta. A large voltage source to base/emitter voltage ratio also maintains a substantially constant emitter current for transistors having different base/emitter voltage drops. This results in a reliable in-circuit test device which provides a high degree of accuracy in testing the beta of transistors connected in a circuit.

DETAILED DESCRIPTION OF THE DRAWINGS

An illustrative and presently preferred embodiment of the invention is shown in the accompanying drawings wherein.

DETAILED DESCRIPTION OF THE PRESENT INVENTION

Figure 1:
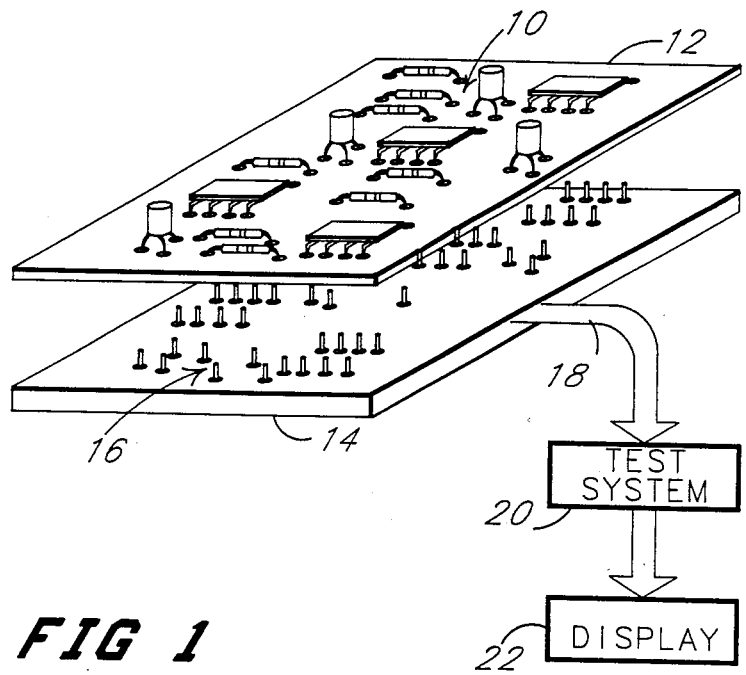
FIG. 1 is a schematic drawing illustrating the overall in-circuit testing system of the present invention.

FIG. 1 is a schematic illustration of the system for in-circuit testing of components 10 which are connected in a printed circuit board 12. A test-bed 14 employs a series of connectors 16 which are placed at predetermined locations to connect with predetermined nodes on printed circuit board 12 so that in-circuit tests can be performed on the various components 10 mounted on the printed circuit board 12. Connector cable 18 has a number of individual conductors which are each coupled to the plurality of connector 16 mounted in the test-bed 14. The cable 18 is fed to a test system 20 which comprises a computer system or state logic device and the associated devices for running the test such as signal generators, voltage supplies, current supplies, comparators and signal processors for analyzing the data and preparing a display signal which is indicated on display 22. Display 22 can comprise any desired display device including CRT's, LCD's, hard printout or other type of device for displaying the information generated by test system 20.

Figure 2:
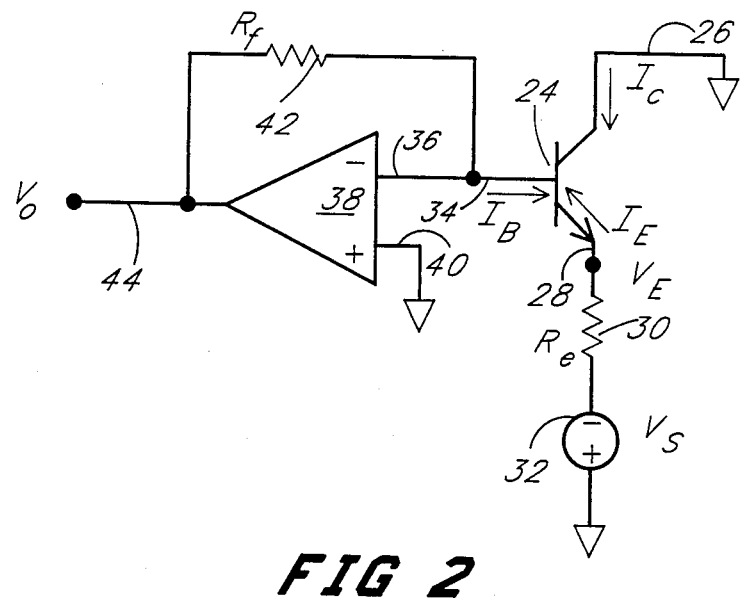
FIG. 2 is a schematic drawing illustrating an implementation of the test circuit of the present invention.

FIG. 2 is a schematic illustration of a test circuit implementing the present invention. As illustrated in FIG. 2, the device under test comprises a transistor 24. The collector lead 26 of transistor 24 is connected directly to ground potential through the test circuit. The emitter lead 28 is connected to an emitter resistor ($R_E$) 30 which is in turn connected to a constant voltage supply ($V_S$) 32. The base lead 34 of transistor 24 is connected to the inverting input 36 of operational amplifier 38. The non-inverting input 40 of operational amplifier 38 is coupled to ground potential. Feedback resistor ($R_F$) 42 is coupled between output 44 of operational amplifier 38 and inverting input 36 of operational amplifier 38.

Figure 3:
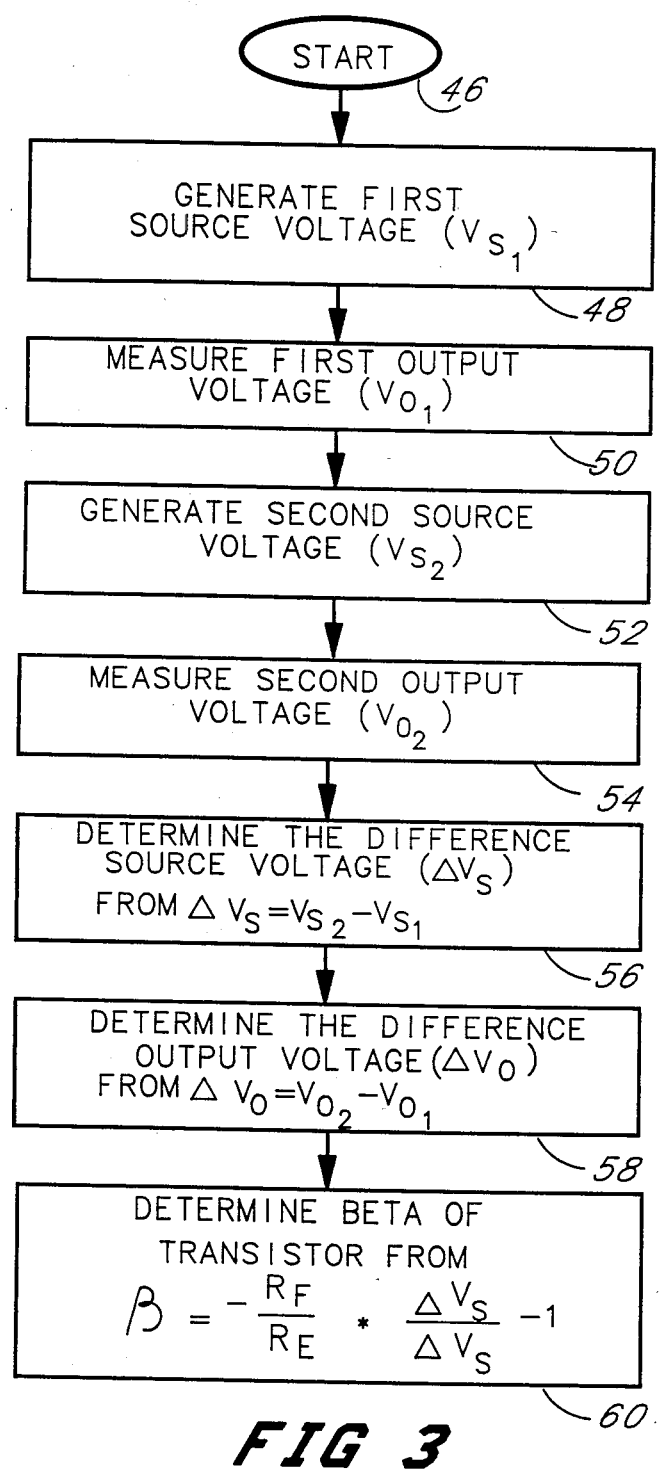
FIG. 3 is a schematic flow diagram illustrating the functional steps employed in the present invention.

FIG. 3 is a schematic block diagram illustrating the operation of the test circuit of FIG. 2. Referring to FIG. 3, the process starts at step 46 and a first source voltage ($V_{S1}$) is generated, as indicated by step 48, in the voltage source 32. Referring again to FIG. 2, the first source voltage ($V_{S1}$) is a DC voltage which is sufficient to cause a voltage drop across the emitter resistor ($R_E$) 30 which forward biases the base/emitter junction to draw an emitter current through the transistor corresponding to the range of currents provided in the specifications for transistor 34. Since the non-inverting input 40 of operational amplifier 38 is tied to ground potential, the inverting input 36 also maintains approximately a zero voltage potential. Additionally, since input 36 has nearly infinite input resistance, all of the base current ($I_B$) flows through feedback resistor 42 producing an output voltage ($V_0$) at the output 44 of operational amplifier 38 equal to the base current ($I_B$) multiplied by the feedback resistance ($R_F$).

Additionally, since the voltage on the base lead 34 is maintained at essentially zero potential, the voltage drop across the base/emitter junction is approximately 0.7 volts so that the emitter voltage ($V_E$) is approximately −0.7 volts. Also, since the collector lead 26 is tied to ground potential and the voltage potential on the emitter lead ($V_E$) is approximately −0.7 volts, the voltage drop from collector to emitter is also −0.7 volts and remains essentially constant regardless of the current flowing through the collector since there is no resistance in the collector lead. Hence, the collector/emitter voltage drop is high enough to keep the transistor from going into the base emitter voltage drop as long as the transistor is biased on. Moreover, both the base and collector leads are held at essentially zero voltage potential while the emitter lead is held at −0.7 volts so that voltage levels are maintained at low levels which prevents other components connected to the transistor on the printed circuit board from being activated. Operational amplifier 38 functions to both hold the base 34 at zero potential and provide a voltage output which is directly proportional to the current ($I_B$) in base lead 34.

Referring again to FIG. 3, the output voltage ($V_{01}$) for the first source voltage ($V_{S1}$) is measured at step 50. The voltage of voltage source ($V_S$) 32 (FIG. 2) is then changed to another d.c. voltage level, i.e., a second source voltage ($V_{S2}$), and the circuit is allowed to settle to steady state conditions. A second measurement of output voltage ($V_{02}$) is then made at output 44 of operational amplifier 38 at step 54. At step 56 the difference between the source voltages ($V_{S2}-V_{S1}$) is then determined. This step is performed in the test system 20, illustrated in FIG. 1, using standard techniques for deriving different signals. Similarly, the difference between output voltages ($V_{02}-V_{01}$) is determined in test system 20 at step 58. The beta of the transistor is then calculated at step 60 as follows:

$$\text{beta} = +(R_F/R_E)(\Delta V_S/\Delta V_0) - 1 \tag{1}$$

Hence, the beta of the transistor can be determined by simply measuring the difference in the source voltages divided by the difference in the output voltages multiplied by a constant equal to feedback resistance divided by the emitter resistance, the entire quotient minus one.

Figure 4:
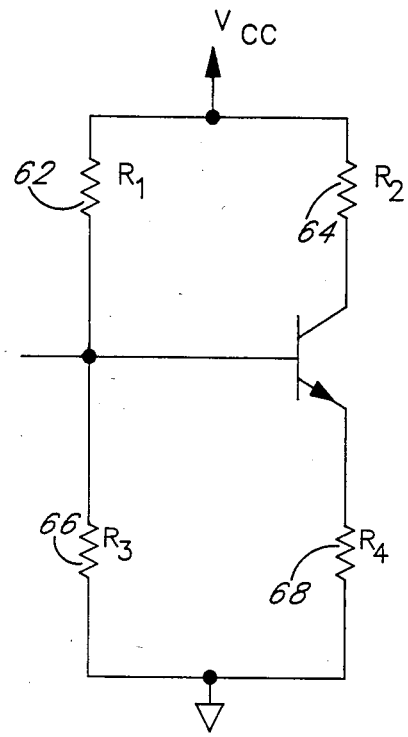
FIG. 4 is a schematic diagram illustrating a typical series of connections of a transistor connected in a PC board under test.

FIG. 4 is a schematic illustration of one typical way in which a transistor may be connected to other components such as resistors 62, 64, 66 and 68 in a printed circuit board. The connection of these components has typically caused problems in prior art in-circuit test devices because of the feedback loops that are created by this and other similar circuit topologies.

Figure 5:
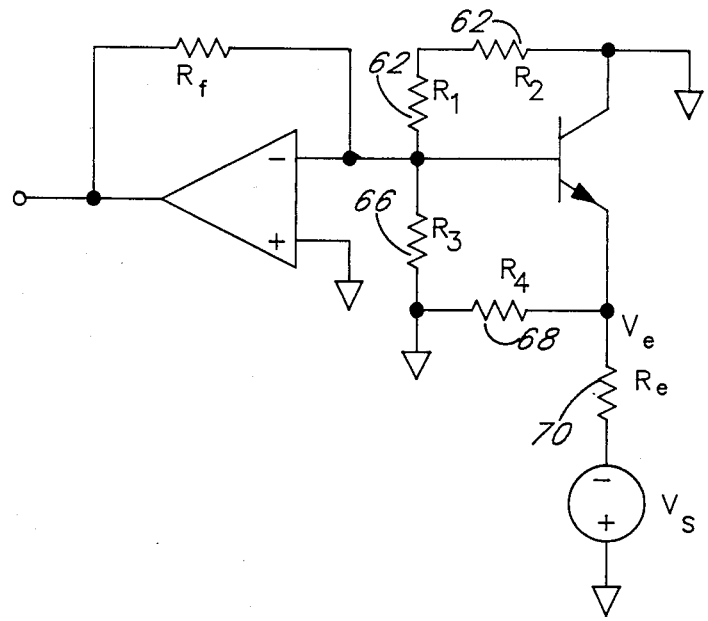
FIG. 5 is a schematic illustration of the manner in which the test circuit of the present invention is coupled to the circuit illustrated in FIG. 4.

FIG. 5 illustrates the feedback loops which are created when the test circuit of the present invention is connected to a typical circuit such as illustrated in FIG. 4. As shown in FIG. 5, resistive paths are provided between the base and emitter leads to ground potential which may affect the calculation of the beta of the transistor if a single current were used to make measurements to calculate the beta of the transistor. For example, the current flowing through resistor 68 ($R_4$) decreases the total emitter current. As can be seen in FIG. 5, if calculations of beta were made based upon the constant current supplied by $V_S$ divided by $R_E$, such calculations would be incorrect because all of the current flowing through resistor 70 ($R_E$) does not flow through the emitter of the transistor, i.e., a portion of the current flows through resistor 68 ($R_4$) to ground.

The present invention overcomes these problems by maintaining the voltage on the emitter ($V_E$) at a constant potential, i.e. approximately $-0.7$ volts, and applies two different emitter currents to the emitter of the transistor. In this manner, the difference in the emitter currents, as represented by the difference between source voltages ($\Delta V_S$) is a direct measure of the emitter current since the current through resistor 68 ($R_4$) does not change because $V_E$ remains essentially constant. Consequently, the difference in the base current as represented by $\Delta V_O$ when compared to the difference in the emitter currents as represented by $\Delta V_S$ provides an accurate measurement of the beta of the transistor regardless of the current flowing through resistor 68 ($R_4$).

Additionally, by using two different d.c. currents, the effects of any feedback paths that could be created through series coupled capacitors are eliminated which can act as impedance paths when a.c. sources are used, as is typically the case in prior art devices. Hence the use of two d.c. signals to measure the beta of the transistor eliminates the problem created by feedback paths created by capacitors on the printed circuit board which have typically affected the measurement of the beta of the transistor when using prior art in circuit testing techniques.

When determining the values that should be used for the source voltage ($V_S$) 32 (FIG. 2) and the emitter resistance 30 ($R_E$), it should be remembered that the base/emitter voltage can vary by typically up to 0.2 volts from transistor to transistor. To minimize the effects of these variations, the source voltage ($V_S$) should be made much larger than the base/emitter voltage drop so that the differences in emitter currents which are applied to the various transistors that are tested on different boards are not substantial. Hence, $V_S$ should be substantially greater than approximately 0.7 volts, i.e., on the order of two to ten volts, or greater.

Consequently, the present invention provides an automated in-circuit testing procedure which can determine the beta of the transistor with a high degree of accuracy while using low voltages so that other components on the circuit board are not activated, while simultaneously maintaining the collector/emitter voltage of the transistor at a sufficiently high level to prevent the transistor from going into saturation. Different d.c. signals are applied to the emitter lead of the transistor while the emitter voltage is maintained at a constant level so that the effects of parallel impedance paths do not affect the measurement of the beta of the transistor. This provides a high degree of accuracy in measuring the beta of the transistor and essentially eliminates the complex problems of parallel impedance paths which are typically encountered during in-circuit testing. Since the emitter current is held substantially constant, variations in the beta of the transistor do not cause the transistor to go into saturation, as in prior art devices, allowing the testing system of the present invention to be fully automated in an in-circuit test device and thereby providing highly accurate results with a low test failure rate.

Figure 6:
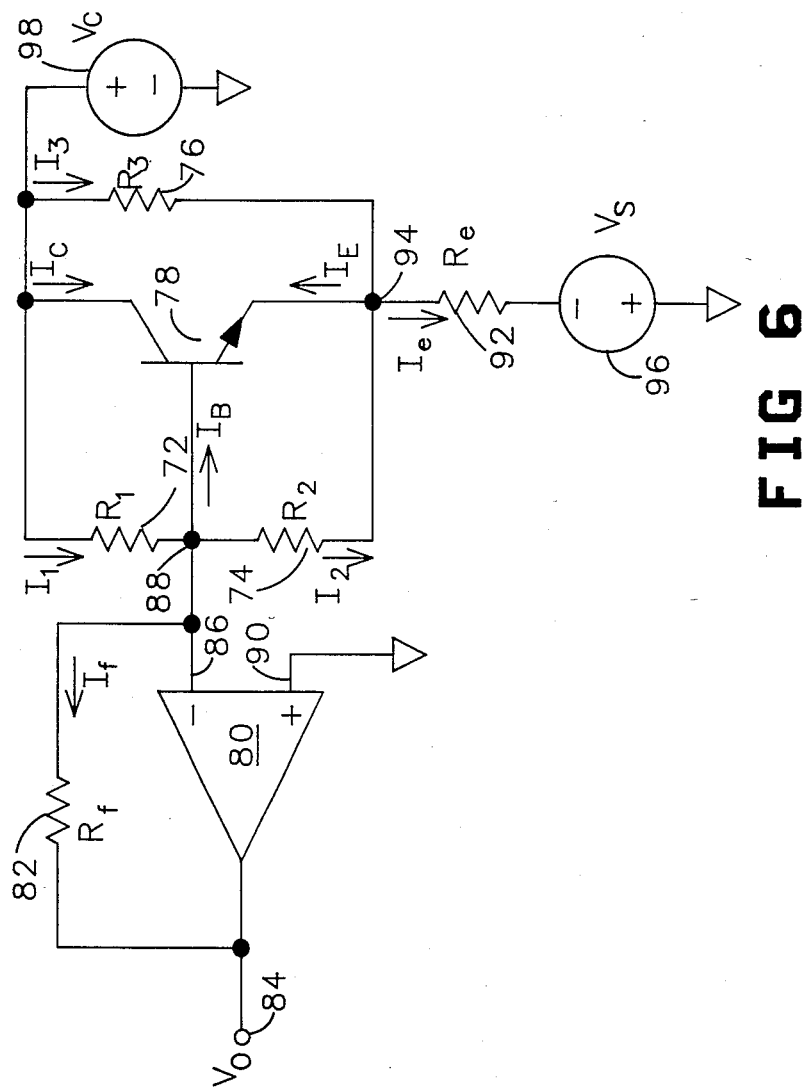
FIG. 6 is a schematic drawing illustrating an implementation of the test circuit of the present invention in which the transistor can be tested at a specified collector/emitter voltage drop.

FIG. 6 is a schematic illustration of another embodiment of the present invention which illustrates the manner in which the collector voltage can be maintained at a voltage level different than the voltage level at the base lead of the transistor under test. Typically, the specification data for a transistor specify certain collector/emitter voltages as well as specifying certain collector currents Although the devices illustrated in FIGS. 2 and 5 are capable of providing a specified collector current in a controlled manner which corresponds to the specification data, the collector/emitter voltage drop is normally maintained at approximately one diode junction voltage transition (approximately 0.7 volts) since the collector voltage is approximately the same voltage as the inverting input to the operational amplifier. Referring to FIG. 6, resistors 72 ($R_1$), 74 ($R_2$) and 76 ($R_3$) are shown in an equivalent circuit coupled to transistor 78 which comprises the device under test. As in the devices illustrated in FIG. 2 and in FIG. 5, the test device of FIG. 6 utilizes an operational amplifier 80 having a feedback resistor ($R_F$) 82 coupled between the output 84 and inverting input 86 of operational amplifier 80. Inverting input 86 is coupled to the base node 88 of transistor 78. The non-inverting input 90 of operational amplifier 80 is coupled to ground.

The test device of FIG. 6 is also similar to the test device illustrated in FIGS. 2 and 5 in that an emitter resistor ($R_E$) 92 is coupled to the emitter node 94 of transistor 78, and source voltage 96 is connected in series to emitter resistor 92 to draw a constant predetermined emitter current from transistor 78.

In addition to the similarities with the test device shown in FIGS. 2 and 5, the embodiment of FIG. 6 additionally uses a collector voltage supply ($V_C$) 98 that applies a predetermined collector voltage to transistor 78. This allows the transistor to be tested at the collector/emitter voltage drop which is specified in the data specifications provided by the manufacturer for the device. In this manner, the collector voltage is carefully controlled so that other active components on the board are not turned on and the transistor 78 can still be tested at manufacturers specifications for emitter current and collector voltage.

When the transistor 78 is biased on the voltages across $R_1$, $R_2$ and $R_3$ are essentially constant even though two different source voltages are applied to the circuit, as shown in FIG. 6. Again, large signal beta is measured as follows:

$$\text{beta} = +(R_F/R_E)(\Delta V_S/\Delta V_0) - 1 \qquad (2)$$

As shown in FIG. 6, the base current is denoted as $I_B$, the emitter current is denoted as $I_E$ and the collector current is denoted as $I_C$. The current flowing through the emitter resistor ($R_e$) 92 is denoted as $I_e$. The current flowing through feedback resistor ($R_f$) 82 is denoted as $I_f$. Similarly, the current flowing through resistors 72 ($R_1$) is denoted as $I_1$, while the current flowing through resistor 74 ($R_2$) is denoted as $I_2$ and the current flowing resistor 76 ($R_3$) is denoted as $I_3$.

Hence, the base current is given by the following equation:

$$I_B = -I_f + I_1 - I_2 \quad (3)$$

The emitter current is given by the following equation:

$$I_B = -I_e + I_2 + I_3 \quad (4)$$

The large signal beta can then be calculated as follows:

*Large Signal Beta = .Emitter Current)/(Base Current)* (1)

An enhanced beta test can be performed by measuring the resistors in the circuit using low voltages to eliminate the effects of diode junctions. The measured resistances can then be used to find $I_1$, $I_2$, and $I_3$.

To measure small signal beta, measurements are made at two closely spaced emitter currents and the changes in the measured currents are used for the calculations. Hence, the change in base current and change in emitter current are given below:

$$\Delta I_B = -\Delta I_f + \Delta I_1 - \Delta I_2 \quad (5)$$

$$\Delta I_E = -\Delta I_e + \Delta I_3 + \Delta I_2 \quad (6)$$

The small signal beta can then be calculated from equations 5 and 6 as follows:

*Small signal Beta* $= \Delta I_E / I_B - 1$

In this manner, both large signal beta and small signal beta can be calculated for the transistor under test.

The foregoing description of the invention has been presented for purposes of illustration and description. It is not intended to be exhaustive or to limit the invention to precise form disclosed, and other modifications and variations may be possible in light of the above teachings. For example, there are many ways to provide current to the emitter of the transistor. Although the voltage source/emitter resistor combination shown has been given as an example of one simple manner of providing a constant current, any other manner of providing a constant current would be suitable for use in the present invention. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An in-circuit test device for testing transistors in which the base, emitter and collector leads of said transistor are connected to various components on a circuit board under test comprising:
   means for biasing said transistor through said emitter lead at a predetermined emitter current level;
   means for maintaining said base lead and said collector lead at essentially equal voltage levels;
   means for determining the current level in said base lead to calculate gain of said transistor by comparing the predetermined emitter current level with the current level in said base lead.

2. An in-circuit test device for testing transistors which are connected in various ways through the base, emitter and collector leads of said transistor to various components on a circuit board comprising:
   means for biasing said transistor through said emitter lead at more than one emitter current level;
   means for maintaining said base and said collector leads at essentially equal voltage levels;
   means for measuring the current levels in said base lead for said more than one current level in said emitter lead to calculate gain of said transistor from the difference between the current levels measured in said base lead compared to the difference in the current levels in said emitter lead.

3. The in-circuit test device of claim 2 wherein said means for maintaining said base and said collector at essentially equal voltage levels comprises:
   means for maintaining said base and collector leads at a low voltage level to prevent other active components on said circuit board from being activated.

4. The in-circuit test device of claim 2 wherein said means for maintaining said base and said collector leads at essentially equal voltage levels comprises:
   means for coupling said collector lead to ground potential;
   operational amplifier means having a first input coupled to said base lead, an output coupled to said first input through a feedback resistance and a second input coupled to ground potential so that said base lead is maintained at essentially ground potential.

5. An in-circuit test device for testing the gain of a transistor comprising:
   constant current source means coupled to the emitter of said transistor for generating first and second bias currents sufficient to forward bias the base/emitter junction of said transistor;
   operational amplifier means having a first input coupled to ground potential, a second input coupled to the base of said transistor and feedback resistance coupled to said second input and the output of said operational amplifier means such that output voltages are produced at said output of said operational amplifier means in response to said first and second bias currents which are substantially proportional to the current flowing through the base of said transistor and the voltage at the base of said transistor is maintained at approximately ground potential;
   means for coupling the collector of said transistor to ground potential so that the collector/emitter voltage is substantially equal to the base/emitter voltage to prevent said transistor from going into saturation;
   whereby the difference in said output voltages divided by said feedback resistance provides an indication of the gain of said transistor when compared to the differences in said first and second bias currents.

6. The in-circuit test device of claim 5 wherein said constant current source means comprises:
   emitter resistance means coupled to said emitter of said transistor;
   voltage source means coupled to said emitter resistance for generating said first and second bias currents in said emitter resistance by generating first and second d.c. voltages which are substantially greater than said base/emitter voltage so that substantially equal emitter currents are produced for each transistor tested by said in-circuit test device.

7. A method of in-circuit testing to determine the beta of a transistor comprising the steps of:
　connecting the collector of said transistor to ground potential;
　generating a first and second constant current level in the emitter of said transistor sufficient to forward bias the base/emitter junction of said transistor;
　maintaining the voltage of said base of said transistor at approximately ground potential such that the voltage drop between said collector and said emitter is approximately equal to the voltage drop between said base and said emitter;
　measuring the base current of said transistor by detecting the voltage drop across a resistance coupled to said base of said transistor;
　determining the difference between base currents measured for each of said first and second constant current levels generated in said emitter lead of said transistor;
　determining the difference between said first and second constant current levels generated in said emitter lead of said transistor;
　comparing said the difference between said base currents and said difference between said first and second constant current levels to determine the beta of said transistor.

8. The method of claim 7 wherein said step of maintaining the voltage of said base of said transistor at approximately ground potential comprises the steps of:
　coupling one input of an operational amplifier configured with a feedback resistance to said base of said transistor and the other input of said operational amplifier to ground potential.

9. A method of in-circuit testing of a transistor comprising the steps of:
　maintaining the voltage between the collector and emitter of said transistor at a level sufficiently high to prevent saturation;
　generating a first and second constant current in said emitter of said transistor;
　measuring first and second base currents of said transistor for said first and second constant currents generated in said emitter;
　determining the difference between said first and second base currents and the difference between said first and second emitter currents; and
　calculating the beta of said transistor from the difference between said base currents and the difference between said emitter currents.

10. The method of claim 9 further comprising the step of:
　maintaining the voltage between said collector and said emitter of said transistor at a level sufficiently low to prevent other active devices coupled to said transistor from being activated.

11. The method of claim 9 wherein said step of maintaining said voltage between said collector and emitter of said transistor further comprises the steps of:
　fixing said collector and said base at approximately the same voltage potential.

12. The method of claim 9 wherein said step of maintaining said voltage between said collector and said emitter of said transistor further comprises the steps of:
　fixing said collector and said base at approximately ground potential.

13. A process of in-circuit testing to determine the gain of a transistor which is coupled to other components in a circuit and to eliminate the effects of said components comprising the steps of:
　providing at least two levels of d.c. signal to the emitter of said transistor;
　measuring at least two levels of base signal corresponding to said at least two levels of d.c. signal provided to said emitter lead;
　determining the difference between said at least two levels of d.c. signal provided to said emitter lead to produce an emitter difference signal;
　determining the difference between said at least two levels of base signal to produce a base difference signal;
　comparing said emitter difference signal an said base difference signal to determine the gain of said transistor.

14. An in-circuit test device for testing transistors in which the base, emitter and collector leads of said transistor are connected to various components on a circuit board under test comprising:
　means for biasing said transistor through said emitter lead at a predetermined emitter current level;
　means for maintaining said collector lead at a first predetermined voltage level;
　means for maintaining said base lead at a second predetermined voltage level so that a preselected voltage transition is produced between said collector lead and said emitter lead;
　means for determining the current level in said base lead to calculate the gain of said transistor by comparing the predetermined emitter current level with the current level in said base lead.

15. A method of in-circuit testing to determine the beta of a transistor comprising the steps of:
　maintaining the voltage level of the base of said transistor at approximately ground potential;
　generating a first and second constant current level in the emitter of said transistor sufficient to forward bias the base/emitter junction of said transistor;
　maintaining the voltage level of the collector of said transistor at a first predetermined potential such that a voltage drop between said collector and said emitter is sufficient to prevent said transistor from saturating;
　measuring the base current of said transistor by detecting a voltage drop across a resistance coupled to said base of said transistor;
　determining the difference between base currents measured for each of said first and second constant current levels generated in said emitter of said transistor;
　determining the difference between said first and second constant current levels generated in said emitter of said transistor;
　comparing said the difference between said base currents and said difference between said first and second constant current levels to determine the beta of said transistor.

16. The method of claim 15 wherein said voltage drop between said collector and said emitter is a specified voltage for measuring the beta of said transistor.

17. The method of claim 15 wherein said step of measuring said base current comprises measuring current flow on all conductive paths connected to a node coupled to said base to provide an enhanced beta test measurement.

* * * * *